US008117498B1

(12) United States Patent
Wood et al.

(10) Patent No.: US 8,117,498 B1
(45) Date of Patent: Feb. 14, 2012

(54) MECHANISM FOR MAINTAINING CACHE SOFT REPAIRS ACROSS POWER STATE TRANSITIONS

(75) Inventors: Timothy J. Wood, Austin, TX (US); Charles Ouyang, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 12/843,916

(22) Filed: Jul. 27, 2010

(51) Int. Cl.
*G06F 11/00* (2006.01)
(52) U.S. Cl. ................................ 714/30; 714/36; 714/24
(58) Field of Classification Search ......................... None
See application file for complete search history.

(56) References Cited

U.S. PATENT DOCUMENTS

| 5,835,504 | A | 11/1998 | Balkin et al. | |
|---|---|---|---|---|
| 7,240,277 | B2 * | 7/2007 | Anderson et al. | 714/805 |
| 7,437,637 | B2 | 10/2008 | Meaney et al. | |
| 7,487,397 | B2 | 2/2009 | Lockwood et al. | |
| 2008/0022149 | A1 * | 1/2008 | Ouellette et al. | 714/6 |
| 2008/0072088 | A1 * | 3/2008 | Allarey et al. | 713/324 |
| 2008/0148114 | A1 * | 6/2008 | Barth et al. | 714/711 |

\* cited by examiner

*Primary Examiner* — Scott Baderman
*Assistant Examiner* — Jason Bryan
(74) *Attorney, Agent, or Firm* — Meyertons, Hood, Kivlin, Kowert & Goetzel, P.C.; Stephen J. Curran

(57) ABSTRACT

A processor core includes one or more cache memories and a repair unit. The repair unit may repair locations in the cache memories identified as having errors during an initialization sequence. The repair unit may further cause information corresponding to the repair locations to be stored within one or more storages. In response to initiation of a power-down state of a given processor core, the given processor core may execute microcode instructions that cause the information from the one or more storages to be saved to a memory unit. During a recovery of the given processor core from the power-down state, the processor core may execute additional microcode instructions that cause the information to be retrieved from the memory unit, and saved to the one or more storages. The repair unit may restore repairs to the locations in the cache memories using the information.

16 Claims, 4 Drawing Sheets

Computer Accessible Storage Medium 400

Database 420

FIG. 4

MECHANISM FOR MAINTAINING CACHE SOFT REPAIRS ACROSS POWER STATE TRANSITIONS

BACKGROUND

1. Technical Field

This disclosure relates to processor memory repairs and, more particularly, to maintaining memory repairs across power state transitions.

2. Description of the Related Art

In an effort to provide more robust integrated circuits, manufacturers have implemented many testing techniques to ensure that quality devices are shipped to customers. For example, extensive device testing is usually performed before devices are shipped. If errors such as memory failures are found during manufacturing, fuses may be blown to repair these memory failures before the devices are shipped. Nevertheless some devices may develop field failures despite the best manufacturing practices. For example, some devices may experience latent memory or other logic failures that may cause catastrophic failures if theses failures are not caught. Accordingly, many devices include built-in self-test (BIST) units to test devices internally each time a device is powered up. In addition, some devices such as processors and memory devices may include self-repair units that may dynamically repair memory errors that are found by the BIST units.

Many new computing platforms include advanced power management features which include many different processor power states. More particularly, in multi-core processors there are core power states such as CC0 through CC6. Generally speaking, the higher the number, the less power the core consumes. For example, in a deep power-down state such as the CC6 power state, a core may have the supply voltage removed, or the system clock may be stopped. However, in such systems, if the power is removed, the dynamic repairs made to the memory locations may be lost, and re-running the BIST unit may not be acceptable in many cases due to the time it takes to run BIST when coming out of these deep power-down states.

SUMMARY OF EMBODIMENTS

Various embodiments of a mechanism for maintaining cache soft repairs across power state transitions are disclosed. In one embodiment, a processing unit includes at least one processor core. Each core may include one or more cache memories and a repair unit. The repair unit may be configured to repair locations in the one or more cache memories identified as having errors by, for example, a memory built-in self-test (MBIST) unit during an initialization sequence such as a chip-level power up sequence, for example. The repair unit may be further configured to cause information corresponding to the repair locations to be stored within one or more storages. In response to an initiation of a power-down state such as a C6/CC6, for example, of a given processor core, the given processor core may be configured to execute microcode instructions in a microcode unit, for example, that cause the information from the one or more storages to be saved to a memory unit. During a subsequent recovery of the given processor core from the power-down state, the given processor core may execute additional microcode instructions that cause the information to be retrieved from the memory unit, and to be saved to the one or more storages. The repair unit may then restore the repairs to the corresponding locations in the one or more cache memories using the information retrieved from the memory unit.

In one specific implementation, the MBIST unit may be configured to perform diagnostics on the one or more cache memories during the initialization sequence, but not during recovery from the power-down state based upon a run signal.

In another specific implementation, the information corresponding to the repair locations is saved in the one or more storages using a format that may be used for example, by a fuses sequencer when repairing the cache memories during the initialization sequence. The format includes a plurality of fields that may identify a cache type, a macro destination, and a row/column of the one or more cache memories to be repaired.

BRIEF DESCRIPTION OF THE DRAWINGS

FIG. 4 is a block diagram of one embodiment of a computer accessible storage medium including a database representative of the processing node 12 of FIG. 1.

Figure 1:
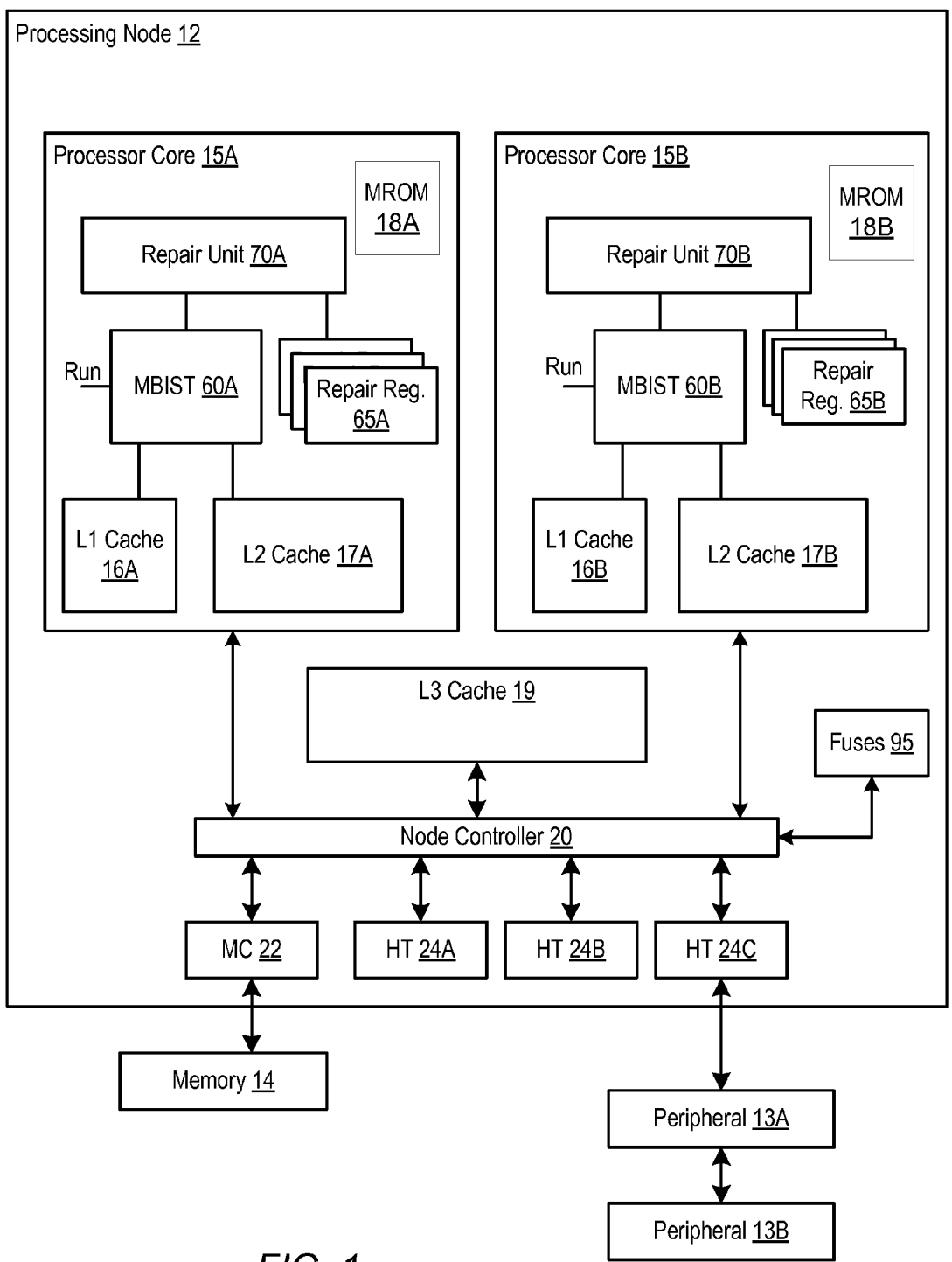
FIG. 1 is a block diagram of one embodiment of a computer system.

Specific embodiments are shown by way of example in the drawings and will herein be described in detail. It should be understood, however, that the drawings and detailed description are not intended to limit the claims to the particular embodiments disclosed, even where only a single embodiment is described with respect to a particular feature. On the contrary, the intention is to cover all modifications, equivalents and alternatives that would be apparent to a person skilled in the art having the benefit of this disclosure. Examples of features provided in the disclosure are intended to be illustrative rather than restrictive unless stated otherwise.

As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph six, interpretation for that unit/circuit/component.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

DETAILED DESCRIPTION

Turning now to FIG. 1, a block diagram of one embodiment of a computer system 10 is shown. In the illustrated embodiment, the computer system 10 includes a processing node 12 coupled to memory 14 and to peripheral devices 13A-13B. The node 12 includes processor cores 15A-15B coupled to a node controller 20 which is further coupled to a memory controller 22 and a plurality of HyperTransport™ (HT) interface circuits 24A-24C. The HT circuit 24C is coupled to the peripheral device 13A, which is coupled to the peripheral device 13B in a daisy-chain configuration (using HT interfaces, in this embodiment). The remaining HT circuits 24A-B may be connected to other similar processing nodes (not shown) via other HT interfaces (not shown). The memory controller 22 is coupled to the system memory 14. In one embodiment, node 12 may be a single integrated circuit chip comprising the circuitry shown therein in FIG. 1. That is, node 12 may be a chip multiprocessor (CMP). Other embodiments may implement the node 12 as two or more separate integrated circuits, as desired. Any level of integration or discrete components may be used. It is noted that components having a number and a letter as a reference designator may be referred to by the number only where appropriate.

It is also noted that, while the computer system 10 illustrated in FIG. 1 includes one processing node 12, other embodiments may implement any number of processing nodes. Similarly, a processing node such as node 12 may include any number of processor cores, in various embodiments. Various embodiments of the computer system 10 may also include different numbers of HT interfaces per node 12, and differing numbers of peripheral devices 13 coupled to the node, etc.

In one embodiment, node controller 20 may include various interconnection circuits (not shown) for interconnecting processor cores 15A and 15B to each other, to other nodes and to memory. Node controller 20 may also include logic such as fuse sequencer logic that may read fuse configurations from fuses 95, which may be selectively blown during the manufacturing process. In some embodiments, various node properties that may be selected by the fuses 95. The properties include the maximum and minimum operating frequencies for the node and the maximum and minimum power supply voltages for the node. In addition, as described further below, the fuses 95 may select processor-core specific properties such as repair locations for the L1 caches 16A-16B, as well as the L2 caches 17A-17B, and in some embodiments, other memories such as the L3 cache 19 and the translation lookaside buffer (TLB) (not shown), etc.

The memory 14 may include any suitable memory devices. For example, a memory 14 may comprise any of a variety of memory devices in the dynamic random access memory (DRAM) family. For example, memory 14 may be implemented using synchronous DRAMs (SDRAMs), double data rate (DDR) SDRAM, and the like. In addition, some portions of memory 14 may be implemented using static RAM (SRAM), etc. Memory 14 may be implemented using one or more memory modules each including one or more memory devices. The memory controller 22 may comprise control circuitry for interfacing to the memory 14.

The HT circuits 24A-24C may comprise a variety of buffers and control circuitry for receiving packets from an HT link and for transmitting packets upon an HT link. The HT interface comprises unidirectional links for transmitting packets. Each HT circuit 24A-24C may be coupled to two such links (one for transmitting and one for receiving). A given HT interface may be operated in a cache coherent fashion (e.g. between processing nodes) or in a non-coherent fashion (e.g. to/from peripheral devices 13A-13B).

It is noted that, while the present embodiment uses the HT interface for communication between nodes and between a node and peripheral devices, other embodiments may use any desired interface or interfaces for either communication. For example, other packet based interfaces may be used, bus interfaces may be used, various standard peripheral interfaces may be used (e.g., peripheral component interconnect (PCI), PCI express, etc.), etc.

The peripheral devices 13A-13B may be any type of peripheral devices. For example, the peripheral devices 13A-13B may include devices for communicating with another computer system to which the devices may be coupled (e.g. network interface cards, circuitry similar to a network interface card that is integrated onto a main circuit board of a computer system, or modems).

Generally, a processor core (e.g., 15A-15B) may include circuitry that is designed to execute instructions defined in a given instruction set architecture. That is, the processor core circuitry may be configured to fetch, decode, execute, and store results of the instructions defined in the instruction set architecture. For example, in one embodiment, processor cores 15A-15B may implement the x86 architecture. The processor cores 15A-15B may comprise any desired configurations, including superpipelined, superscalar, or combinations thereof. Other configurations may include scalar, pipelined, non-pipelined, etc. Various embodiments may employ out of order speculative execution or in order execution. The processor core may include microcoding for one or more instructions or other functions, in combination with any of the above constructions. More particularly, each the processor cores 15 includes a microcode read only memory (MROM) (e.g., 18A and 18B) that stores microcode. A variety of mechanisms may exist for generating entry points to the microcode to run specific routines. Various embodiments may implement a variety of other design features such as caches (e.g., L1 and L2 caches 16 and 17), TLBs, etc. It is noted that processor cores 15A, 15B may be identical, similar or dissimilar (e.g., two identical central or graphics processing units; two similar, but not identical, central processing or graphic processing units; or two different types of cores).

In the illustrated embodiment, processor core 15A includes an L1 cache 16A and an L2 cache 17A. Likewise, processor core 15B includes an L1 cache 16B and an L2 cache 17B. The processor core 15A also includes an MBIST unit 60A, a number of repair registers 65A, and a repair unit 70A. Similarly, processor core 15B includes an MBIST unit 60B, a number of repair registers 65B, and a repair unit 70B. The L1 and L2 caches may be representative of any L1 and L2 cache found in a microprocessor. In one embodiment, the L1 caches 16A and 16B may each comprise an instruction cache (I-cache) and a data cache (D-cache).

In addition, in one embodiment, each of the L1 and L2 caches may be implemented with repairable arrays having redundant circuits so that one or more locations within the L1 and L2 caches may be repaired. For example, during production testing fuses 95 may be blown so that each time the processing node 12 or a processor core comes out of reset, the fuses may determine which locations need to be repaired and the repairs are carried out. In addition, MBIST units 60A and 60B may be configured to run diagnostics on the L1 caches 16, L2 caches 17, respectively, as well as any other memory structures (not shown) on each processor core 15A-15B. The MBIST units 60A-60B may detect failing locations during MBIST operation in the field. As will be described in greater detail below, in response to the MBIST units 60 detecting a failure of a memory structure (e.g., L1 cache, L2 cache, etc.), the repair units 70 may be configured to repair the failing locations, and cause the repair information corresponding to the failing locations to be stored within repair registers 65A and 65B, respectively. These types of repairs are sometimes referred to as soft repairs. It is noted that although only one MBIST unit 60 is shown in each core, it is contemplated that in other embodiments each memory may include a corresponding MBIST unit 60. It is also noted that in other embodiments, the repair units 70 may be part of the MBIST units 60. More particularly, in one embodiment repair units may be representative of self-repair engine logic that may be either part of or separate from the respective MBIST units.

In one embodiment, MBIST units 60 may run the diagnostics each time node 12 is powered up from certain power-down modes or brought out of reset. However, as mentioned above, MBIST units 60 may take more time to execute than is acceptable in some modes. In one embodiment, the Run signal is not asserted when a core comes out of a core power down mode such as C6/CC6. Accordingly, during some power-down modes such as power mode C6/CC6, for example, MBIST units 60 may not run. In such cases, upon detecting that a power-down mode such as CC6 has been initiated for a given processor core 15, the repair information stored in the corresponding repair register 65 is saved to memory 14. In one embodiment, the memory 14 may not be powered down to preserve the memory contents, even if one or more cores are powered down. In other embodiments, the information from the repair registers 65 may be stored in a non-volatile portion of memory 14. Accordingly, upon returning from the power-down state, the repair information is retrieved from the memory 14, the soft repairs are restored, and the repair information is stored to repair registers 65. It is noted that in one embodiment, the repair registers 65 may be implemented using logic state elements such as flip-flops, for example, in which data stored therein may survive a warm reset, although other types of storages are possible and contemplated.

In one embodiment, the repair units 70 may cause the repair information to be stored to the repair registers 65. Upon detecting that a power-down mode such as CC6 has been initiated for a given processor core 15 the processor core begins executing microcode. A particular microcode routine then causes the repair information stored in the repair registers 65, to be stored in memory 14. Upon recovering from the power-down state, the affected processor core 15 begins executing microcode. Another particular microcode routine causes the repair information stored in memory 14 to be stored in the repair registers 65. In one embodiment, the repair units 70 also restore the repairs to the caches using the repair information that was retrieved from memory 14 and stored in the repair registers 65.

It is noted that multiple repair registers 65A and 65B are shown within each core. Since each memory may have multiple repairable arrays, in one embodiment, each memory may have a corresponding repair register 65. In other embodiments, each repairable array within a given memory may have a corresponding repair register 65. More particularly, as described in greater detail below in conjunction with the descriptions of FIGS. 2A-2C, in one embodiment, the L1 I-cache arrays, the L1 D-cache arrays, and the L2 tag and data arrays may each be associated with one or more respective repair registers 65.

Figure 2A:
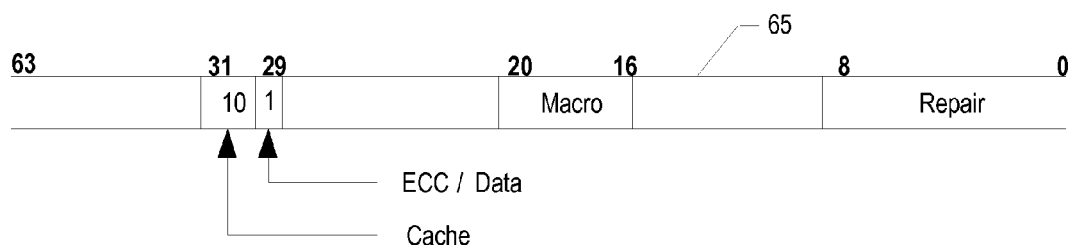
FIG. 2A is a diagram of one embodiment of a repair register format used in the repair registers shown in FIG. 1.
Figure 2B:
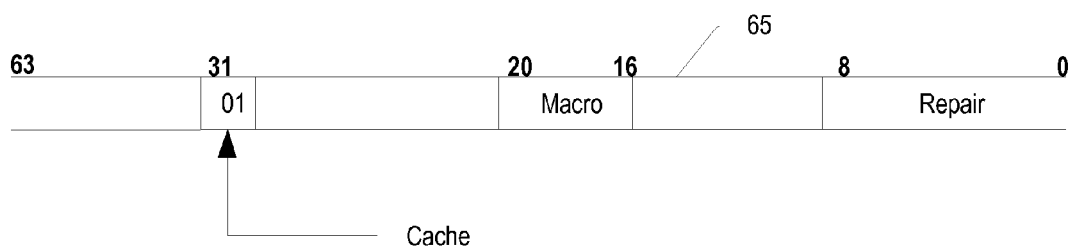
FIG. 2B is a diagram of another embodiment of a repair register format used in the repair registers shown in FIG. 1.
Figure 2C:
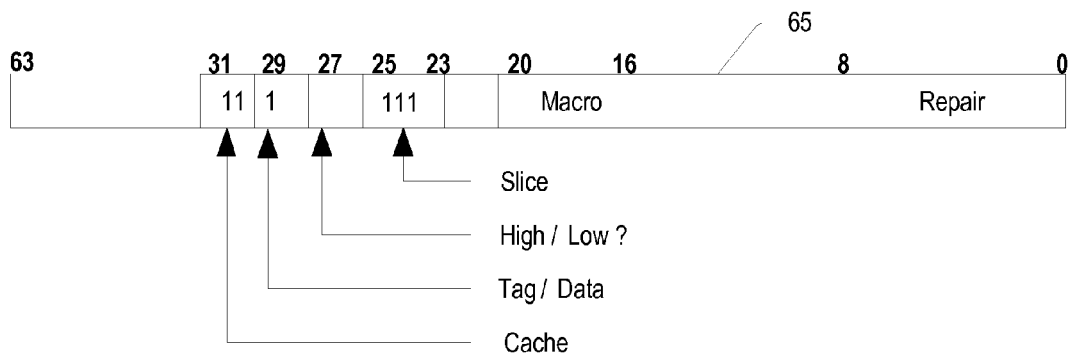
FIG. 2C is a diagram of another embodiment of a repair register format used in the repair registers shown in FIG. 1.

In addition, to more easily affect the soft repairs, in one embodiment, the format of the repair registers 65 may be the same as the format used by the fuse sequencer when restoring repairs from the fuses 95. More particularly, in one embodiment the fuse sequencer may write the repair information derived from the fuses 95 onto an SRB bus in a broadcast fashion. The appropriate repair unit 65 may respond to the address in the repair information. The repair units 70 may use this information to repair the arrays. In one embodiment, the SRB bus may be 64 bits wide. Accordingly, the repair information is conveyed in a particular format, and the soft repair information may be stored in the repair registers 65 and to memory 14 in the same format. FIG. 2A through FIG. 2C are diagrams that depict various embodiments of the formatting of the repair information stored in repair registers such as repair registers 65A and 65B shown in FIG. 1. An exemplary set of definitions of the repair information that is stored within the repair registers 65 is shown in Table 1, below.

TABLE 1

Repair Register Definitions

| Mnemonic | Bits | Description |
| --- | --- | --- |
| UC_SPBIT_FC_CACHE | 31:30 | Cache type:<br>00 - L3<br>01 - IC<br>10 - DC<br>11 - L2 |
| UC_SPBIT_FC_TAG | 29 | Used to distinguish an L2 tag versus L2 data repair. |
| UC_SPBIT_FC_ECC | 29 | Used to distinguish an ECC repair versus a data repair in DC. |
| UC_SPBIT_FC_ROW | 28 | This field is only used in the L2 to distinguish a row repair from a column repair. |
| UC_SPBIT_FC_HVAL | 27 | This field is only used in the L2 to denote a repair to the high versus low side of the array with respect to column repairs. |
| UC_SPBIT_FC_SLICE | 25:23 | This field is only used in the L2 to select one of up to eight slices. |
| UC_SPBIT_FC_MACRO | 20:16 | This field determines the macro destination for the repair. |
| UC_SPBIT_FC_REPAIR | 8:0 | This field contains either the row or column being repaired. |

As shown below in Table 1, the repair information for a single repair includes 32 bits arranged into several fields each having one or more bits. The fields determine cache type, which array, row or column repair, the Macro destination, and the actual row or column to be repaired, etc. Thus, depending on the type of memory being repaired, the formatting may be slightly different. For example, as shown in FIG. 2B, if the memory is an L1 instruction cache, bits 29 and 27 may not be used. It is noted that the encodings shown above in Table 1 are exemplary in nature and may be different in other embodiments.

Turning to FIG. 2A, one embodiment of a repair register format for the data cache portion of the L1 cache of FIG. 1 is shown. In the illustrated embodiment, the repair register 65 is a 64-bit register in which the format of the lower 32 bits is duplicated in the upper 32 bits. As shown, the repair encoding scheme for the L1 data cache arrays is shown in the lower 32 bits of the repair register 65. Accordingly, in this embodiment, the repair register 65 of FIG. 2A may hold repair information for two repairs.

In one embodiment, the repair logic for the data and error correction code (ECC) arrays of the data portion of the L1 data cache 16 may be shared. Thus a single repair register 65 may be used as the soft repair storage for both the data and ECC arrays.

In one embodiment, both these arrays may only support column repairs (up to two) and need 6 bits for the encoded column repair and one bit to indicate whether the repair is in the left or right side of the array. There are 32 data array macros and 8 ECC array macros, so 1 bit is needed to distinguish data versus ECC and 5 additional bits determine one of up to 32 macros.

Since the register 65 of FIG. 2A is an L1 data cache repair register, bits 31:30 contain the cache encoding of 10b to indicate an L1 data cache repair. Bit 29 selects whether this repair is for an ECC array (bit 29=1) or a data cache array (bit 29=0). Bits 20:16 contain the identifier for the macro to be repaired. Bits 8:0 hold the column repair value. Bits 8:7 of the column repair value are unused and will always be zeros. The remaining fields are unused. A second repair in the upper 32 bits of the soft repair buffer would have the same formatting. Any unused fields are reserved and any read data from these fields may not be relied on.

Referring to FIG. 2B, one embodiment of a repair register format for the instruction cache portion of the L1 cache of FIG. 1 is shown. In one embodiment, the repair logic for the L1 instruction cache may be shared among all the arrays that make up the instruction cache portion of the L1 cache 16. In one embodiment, these arrays may only support column repairs (up to two) and need 6 bits for the encoded column repair (LSB is unused, so it's really 5 bits) and one bit to indicate whether the repair is in the top or bottom half of the array. There are 16 instruction cache array macros; thus four bits are needed to determine one of up to 16 macros.

Similar to the register 65 of FIG. 2A, the repair register 65 of FIG. 2B, is also a 64-bit register in which the format of the lower 32 bits is duplicated in the upper 32 bits. As shown in FIG. 2B, the repair encoding scheme for the L1 instruction cache arrays is shown in the lower 32 bits of the repair register 65. Bits 31:30 contain the cache encoding of 01b to indicate an instruction cache repair. Bits 20:16 contain the identifier for the macro to be repaired. In this field, bits 20:17 are the 4 bits used to specify the macro while bit 16 is used to distinguish the upper versus lower half of the array. Bit 16 was formerly used to identify failures in the left versus right half of the array, but a change to the redundancy scheme moved this to the current upper versus lower designation. Bits 8:0 hold the column repair value. Bits 8:6 and bit 0 of the column repair value are unused and will always be zeros. The remaining fields are unused. A second repair in the upper 32 bits of the soft repair buffer would have the same formatting. Any unused fields are reserved and any read data from these fields may not be relied on.

Referring to FIG. 2C, one embodiment of a repair register format for the L2 cache of FIG. 1 is shown. In one embodiment, the soft repairs for the L2 tag and data arrays may happen serially. Accordingly, one repair register 65 may be shared for the tag and data arrays. In one embodiment, the L2 tag arrays may only support column repairs (up to two) and need 6 bits for the encoded column repair and one bit to indicate whether the repair is in the low or high half of the array. There are eight slices and four L2 tag macros per slice; thus five bits are needed to determine one of up to 32 macros.

Similar to the register 65 of FIG. 2A and FIG. 2B, the repair register 65 of FIG. 2C, is also a 64-bit register in which the format of the lower 32 bits is duplicated in the upper 32 bits. As shown in FIG. 2B, the repair encoding scheme for the L2 cache 17 shown in the lower 32 bits of the repair register 65. More particularly, bits 31:30 contain the cache encoding 11b to indicate an L2 cache repair. Bit 29 will be set to a 1 to indicate a tag repair. Bit 27 will indicate if the repair is in the high (bit 27=1) or low (bit 27=0) half of the array. Bits 25:23 contain the slice (one of up to eight). Bits 20:16 contain the identifier for the macro to be repaired within the slice. Bits 8:0 hold the column repair value. Bits 8:7 of the column repair value are unused and will always be zeros. The remaining fields may be unused and reserved and any read data from these fields may not be relied on.

It is noted that although the repair register shown in FIGS. 2A-2C are 64-bit registers, it is contemplated that in other embodiments the repair registers may have a different number of bits, and may thus hold information for other numbers of repairs.

Figure 3:
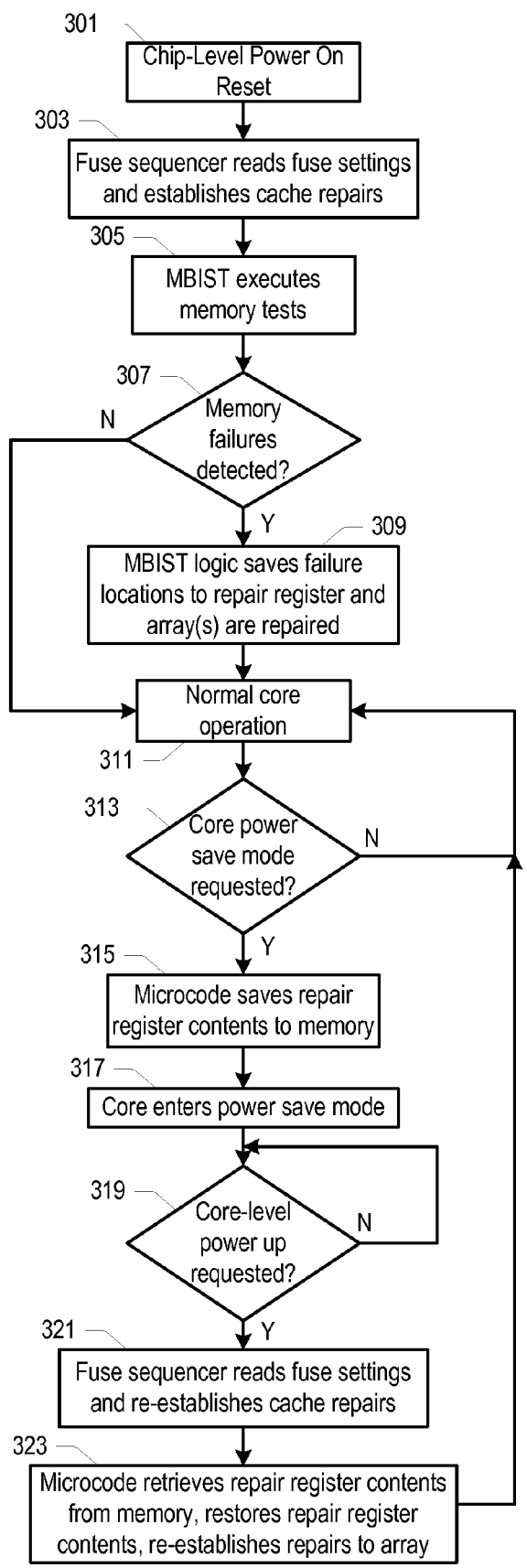
FIG. 3 is a flow diagram of one embodiment of the operation of a processor core of FIG. 1.

FIG. 3 is a flow diagram describing exemplary operational aspects of an embodiment of the processing node shown in FIG. 1. Referring collectively to FIG. 1 through FIG. 3 and beginning in block 301 of FIG. 3 when the processing node 12 is powered up via a chip-level power on reset operation. The fuse sequencer (not shown) within the node controller 20 reads and interprets the settings of fuses 95 and sends the corresponding cache repair values to the repair units 70A and 70B via the SRB bus. The repair units 70 then repair the L1 and L2 caches 16 and 17, respectively, as necessary (block 303). During the power-on initialization sequence, the MBIST units 60 check the Run signal, and if asserted, the MBIST units 60A and 60B perform diagnostic routines to test the various memories and storages in each respective core 15 (block 305). If there are no memory failures detected (block 307), the remainder of the power-on sequence may continue and normal core operation proceeds (block 311).

However, if the MBIST units 60A or 60B detect failures (block 307), the repair units 70 that are associated with the MBIST unit 60 that detected the failure(s) causes the failure location information to be saved to the corresponding repair register 65 as described above. The repair units 70 use the repair information to repair the failing location(s) (block 309). Once the repairs are performed, the remainder of the power-on sequence may continue and normal core operation proceeds (block 311).

At virtually any time, a transition to a power-down mode or state such as the CC6 state, for example, may be initiated on a given processor core 15 (block 313). In response, the processor core that is being powered down may execute microcode as part of the power down sequence. As described above, a portion of the microcode may include instructions that when executed cause the contents of the repair registers 65 to be saved memory 14 (block 315). The remainder of the power-down sequence may be completed and the processor core 15 enters the power down state (block 317) where it will stay until a core reset or restore operation is requested (block 319).

If a recovery from the power-down state is requested (block 319), along with other power-up sequence operations, the fuse sequencer (not shown) reads and interprets the fuses 95 and sends the corresponding cache or memory repair values to the repair units 70 of the processor core being powered up. The appropriate repair unit 70 then restores repairs, if any, of the L1 and L2 caches 16 and 17, respectively (block 321).

During the power-on sequence the appropriate MBIST unit 60 checks the Run signal, and if not asserted, the MBIST unit 60 does not run diagnostics. It is noted that "asserted" simply refers to a signal state that indicates that the action should be performed.

Instead, as part of the power up sequence, another microcode routine when executed causes the repair information to be retrieved from memory 14, and stored within repair registers 65 as described above. The repair units 70 use the retrieved repair information to restore the repairs to the location(s) as described above (block 323).

It is noted that although the above embodiments have been described in terms of repairing the L1 and L2 caches, it is contemplated that in other embodiments, other memories within the processing node may be repaired and restored in a similar way. For example, storages such as the TLBs and the L3 cache 19 may similarly have repairable arrays, MBIST units, repair units and repair registers and may thus be repaired and restored similar to the L1 and L2 caches.

Turning next to FIG. 4, a block diagram of a computer accessible storage medium 400 including a database 420 representative of the processing node 12 of FIG. 1 is shown. Generally speaking, a computer accessible storage medium may include any storage media accessible by a computer during use to provide instructions and/or data to the computer. For example, a computer accessible storage medium may include storage media such as magnetic or optical media, e.g., disk (fixed or removable), tape, CD-ROM, or DVD-ROM, CD-R, CD-RW, DVD-R, DVD-RW, or Blu-Ray. Storage media may further include volatile or non-volatile memory media such as RAM (e.g. synchronous dynamic RAM (SDRAM), double data rate (DDR, DDR2, DDR3, etc.) SDRAM, low-power DDR (LPDDR2, etc.) SDRAM, Rambus DRAM (RDRAM), static RAM (SRAM), etc.), ROM, Flash memory, non-volatile memory (e.g. Flash memory) accessible via a peripheral interface such as the Universal Serial Bus (USB) interface, etc. Storage media may include micro-electromechanical systems (MEMS), as well as storage media accessible via a communication medium such as a network and/or a wireless link.

Generally, the database of the processing node 12 carried on the computer accessible storage medium 400 may be a database which can be read by a program and used, directly or indirectly, to fabricate the hardware comprising the processing node 12. For example, the database 420 may be a behavioral-level description or register-transfer level (RTL) description of the hardware functionality in a high level design language (HDL) such as Verilog or VHDL. The description may be read by a synthesis tool which may synthesize the description to produce a netlist comprising a list of gates from a synthesis library. The netlist comprises a set of gates which also represent the functionality of the hardware comprising the processing node 12. The netlist may then be placed and routed to produce a data set describing geometric shapes to be applied to masks. The masks may then be used in various semiconductor fabrication steps to produce a semiconductor circuit or circuits corresponding to the processing node 12. Alternatively, the database on the computer accessible storage medium 400 may be the netlist (with or without the synthesis library) or the data set, as desired.

While the computer accessible storage medium 400 carries a representation of the processing node 12, other embodiments may carry a representation of any portion of the processing node 12, as desired, including any set of agents (e.g. the processor cores 15A-15B, the L3 cache 19, the memory controller 22, and/or the HT Interfaces 24A-24C), or portions of an agent, (e.g., repair registers, MBIST units, etc).

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A processing unit comprising:
a repair unit that, responsive to a power-down state of a processor core, is configured to cause information corresponding to repair locations in a cache memory identified during an initialization sequence to be saved to a memory unit;
the processor core, during recovery from the power down state, is configured to retrieve the information from the memory unit; and
a memory built-in self-test (MBIST) unit configured to perform diagnostics on the cache memory dependent upon a state of a run signal provided to the MBIST unit;
wherein the repair unit is configured to restore repairs to the corresponding repair locations in the cache memory using the information retrieved; and
wherein the run signal is asserted during the initialization sequence, and is not asserted during recovery from the power-down state.

2. The processing unit as recited in claim 1, wherein during recovery of the processor core from the power-down state, the repair unit is configured to repair the corresponding locations in the cache memory using the information retrieved from the memory unit.

3. The processing unit as recited in claim 1, wherein the power-down state is a C6/CC6 power state in which power is removed from the processor core but not the processing unit and memory unit.

4. The processing unit as recited in claim 1, wherein the information corresponding to repair locations is saved in one or more storages using a format that includes a plurality of fields that identifies a cache type, a macro destination, and a row/column of the one or more cache memories to be repaired.

5. The processing unit as recited in claim 1, wherein the processor core generates an entry point into a microcode routine including the microcode instructions and the additional microcode instructions which are executed to save the information from the one or more storages to the memory unit, and to retrieve the information from the memory unit and to save the information within the one or more storages, respectively.

6. A method comprising:
storing within one or more storages of a processor core having one or more cache memories, information corresponding to memory locations of the one or more cache memories that were identified as having errors during an initialization sequence and then subsequently repaired;
a memory built-in self-test (MBIST) unit performing diagnostics on the one or more cache memories dependent upon a state of a run signal provided to the MBIST unit;
asserting the run signal thereby allowing the MBIST unit to perform the diagnostics during the initialization sequence;
saving the information from the one or more storages within a memory unit in response to an initiation of a power-down state of the processor core;
during recovery of the processor core from the power-down state:
retrieving the information from the memory unit;
storing the information within the one or more storages, and repairing the corresponding memory locations; and
de-asserting the run signal thereby preventing the MBIST unit from performing the diagnostics during recovery from the power-down state.

7. The method as recited in claim 6, further comprising repairing the corresponding locations in the one or more cache memories using the information retrieved from the memory unit during recovery of the processor core from the power-down state.

8. The method as recited in claim 6, wherein the power-down state is a C6/CC6 power state in which power is removed from the processor core and not the memory unit.

9. The method as recited in claim 6, further comprising saving the information in the one or more storages using a format that includes a plurality of fields that identifies a cache type, a macro destination, and a row/column of the one or more cache memories to be repaired.

10. The method as recited in claim 6, further comprising generating an entry point into a microcode routine which is executed to save the information from the one or more storages to the memory unit, and to retrieve the information from the memory unit and to save the information within the one or more storages.

11. A system comprising:
a memory;
a processing unit coupled to the memory, wherein the processing unit includes:
    a repair unit that, responsive to a power-down state of a processor core, is configured to cause information corresponding to repair locations in a cache memory identified during an initialization sequence to be saved to the memory;
    the processor core, during recovery from the power down state, is configured to retrieve the information from the memory; and
    wherein the repair unit is configured to restore repairs to the corresponding repair locations in the cache memory using the information retrieved; and
    a memory built-in self-test (MBIST) unit configured to perform diagnostics on the cache memory during the initialization sequence, but not during recovery from the power-down state based upon a run signal.

12. The system as recited in claim 11, wherein during recovery of the processor core from the power-down state, the repair unit is configured to repair the corresponding locations in the cache memory using the information retrieved from the memory unit.

13. The system as recited in claim 11, wherein the power-down state is a C6/CC6 power state in which power is removed from the processor core but not the memory.

14. The system as recited in claim 11, wherein the processor core generates an entry point into a microcode routine including the microcode instructions and the additional microcode instructions which are executed to save the information from the one or more storages to the memory, and to retrieve the information from the memory and to save the information within the one or more storages, respectively.

15. A computer accessible storage medium comprising a data structure which is operated upon by a program executable on a computer system, the program operating on the data structure to perform a portion of a process to fabricate an integrated circuit including circuitry described by the data structure, the circuitry described in the data structure including:
a processing unit comprising:
    a repair unit that, responsive to a power-down state of a processor core, is configured to cause information corresponding to repair locations in a cache memory identified during an initialization sequence to be saved to a memory unit;
    the processor core, during recovery from the power down state, is configured to retrieve the information from the memory unit; and
    a memory built-in self-test (MBIST) unit configured to perform diagnostics on the cache memory dependent upon a state of a run signal provided to the MBIST unit;
    wherein the repair unit is configured to restore repairs to the corresponding repair locations in the cache memory using the information retrieved; and
    wherein the run signal is asserted during the initialization sequence, and is not asserted during recovery from the power-down state.

16. A processing unit comprising:
a processor core including a memory built-in self-test (MBIST) unit configured to perform diagnostics on a cache memory of the processing unit in response to an asserted run signal provided to the MBIST unit;
wherein the run signal is asserted during an initialization sequence of the processor core, and wherein the run signal is not asserted during recovery from a power-down state of the processor core; and
a repair unit configured to restore repairs to locations in the cache memory that were previously identified by the MBIST unit during a previous initialization sequence using information corresponding to the locations retrieved from a memory unit during recovery from the power-down state of the processor core, wherein the information was stored in the memory unit responsive to the power-down state of the processor core.

* * * * *